United States Patent [19]

Politycki

[11] 4,061,814
[45] Dec. 6, 1977

[54] METHOD AND MASKING STRUCTURE FOR CONFIGURATING THIN LAYERS

[75] Inventor: Alfred Politycki, Ottobrunn, Germany

[73] Assignee: Siemens Aktiengesellschaft, Berlin & Munich, Germany

[21] Appl. No.: 564,105

[22] Filed: Apr. 1, 1975

[30] Foreign Application Priority Data

Apr. 3, 1974 Germany .............................. 2416186

[51] Int. Cl.² .............................................. B32B 3/10
[52] U.S. Cl. ...................... 428/196; 427/43; 428/256; 428/919
[58] Field of Search ............. 427/247, 250, 259, 261, 427/43, 282, 96, 35; 204/38 B, 11; 219/121 EB, 121 EM; 250/492; 428/196, 256, 919

[56] References Cited

U.S. PATENT DOCUMENTS

| 2,779,269 | 1/1957 | Hill | 427/282 |
| 3,118,050 | 1/1964 | Hetherington | 219/121 EB |
| 3,192,136 | 6/1965 | Reid | 204/11 |
| 3,402,110 | 9/1968 | Scherrer | 204/11 |
| 3,476,658 | 11/1969 | Corwin | 204/11 |
| 3,878,061 | 4/1975 | Feldstein | 204/11 |

Primary Examiner—Cameron K. Weiffenbach
Attorney, Agent, or Firm—Hill, Gross, Simpson, Van Santen, Steadman, Chiara & Simpson

[57] ABSTRACT

A method for configurating thin layers, particularly in thin film circuits, wherein a layer to be configurated is irradiated with an electron beam passing through a mask to obtain a configuration corresponding to the configuration of selected portions of such a mask, and a mask for use therein, as well as a method of making such mask, in which the mask is so constructed that, in use, the electron beam completely radiates the geometric shadow areas of the supporting elements on the thin film.

8 Claims, 11 Drawing Figures

METHOD AND MASKING STRUCTURE FOR CONFIGURATING THIN LAYERS

BACKGROUND OF THE INVENTION

The invention is directed to a method and mask for configurating thin layers, particularly in thin film circuits, wherein a layer to be configurated is irradiated with an electron beam passing through a mask to obtain a configuration corresponding to the configuration of selected portions of such a mask.

In the production of modern sub-miniaturized thin layer elements it is necessary that thin layers, in particular lacquer layers, be extremely finely configurated, with the conduction paths and interspaces of the structure having a width, at least in part of less than 0.5 $\mu$. The total area occupied by such a structure is, for example, on the order of 5.5 mm$^2$.

On pages 1033-1037 of the Journal of the Electrochemical Society, vol. 116 No. 7, July (1969) there is described an example of such type of miniaturized structure and, as illustrated in FIG. 4 of such publication, an electron-sensitive lacquer is recorded upon, i.e. exposed, in accordance with the desired configuration, by means of a sharply focused electron beam. However, this type of recording, by means of a finely focused electron beam, is a relatively time-consuming process.

Another possibility resides in the irradiation of the layer which is to be configurated, generally a lacquer layer, by means of a mask through which a bundle of electron beams are passed. It will be apparent that this process is similar to the exposing of a light sensitive layer to normal light and UV radiation through a mask, for example, such as employed in photolithograhic processes and the like.

In the past, the production of masks required for the electron-optical production of configurated thin layers was a very difficult problem, as the parts of the mask which were to be impermeable to the electron beam, and not connected to one another, necessitated a suitable supporting structure to provide adequate support. However, such supporting structures were not sufficiently permeable to the electron to achieve the desired efficient results.

BRIEF SUMMARY OF THE INVENTION

It is an object of the invention to overcome the difficulties associated with an insufficient permeability of the supporting structure to the electron beams, which objective is realized, in accordance with the invention, by forming such supporting structure from supporting elements which have a width, in transverse cross section, which is sufficiently small that in use the electron beam will completely radiate the geometric shadow areas of the supporting elements on the thin film. The term geometric shadow areas, as herein employed, is intended to designate those areas which a beam would normally leave in shadow, if the beam action involved a purely geometric transmission, in particular, in the absence of under radiation, i.e. stray radiation, as hereinafter discussed.

The invention thus makes use of the characteristics of the electron beam, whereby it is, in effect, bent into the region of the geometrical shadow of an obstacle and which results from stray radiation which thus causes the electron beams to additionally reach the edge areas of those zones of the layer which is to be configurated and which in accordance with a purely geometric beam path would be covered by the mask structure. This effect, which may be termed "under-radiation" effect, is dependent upon the thickness of the layer which is to be configurated, of the energy possessed by the electrons, as well as the duration of the radiation. Within the layer which is to be configurated the under-radiation zone is, for example, approximately 0.2 $\mu$ wide. If masks are utilized having a size approximately five times that of the structure to be produced, and if electron-optical means are utilized to produce an image of the mask on the layer which is to be configurated, with an image size of one-fifth that of the mask, a support whose supporting elements are approximately 1 $\mu$ in width will have the shadow area thereof completely irradiated so that no image of the support structure appears on the irradiated layer to be configurated.

It will be appreciated that to achieve masked areas of the exact size desired, corresponding corrections in dimensioning of the masking member or members must be taken into consideration as a result of the corresponding size reduction resulting from the radiation beneath the geometric shadow edges of the masking member.

In accordance with a particularly preferred embodiment of theinvention, extremely fine mesh structures are employed as the supporting means for the masking components or members.

The invention also illustrates a novel method of making the masking structures, employing electrolytic deposition of the desired metallic structure forming the mask.

BRIEF DESCRIPTION OF THE DRAWINGS

In the drawings wherein like reference characters indicate like or corresponding parts.

DETAILED DESCRIPTION OF THE INVENTION

Figure 1:
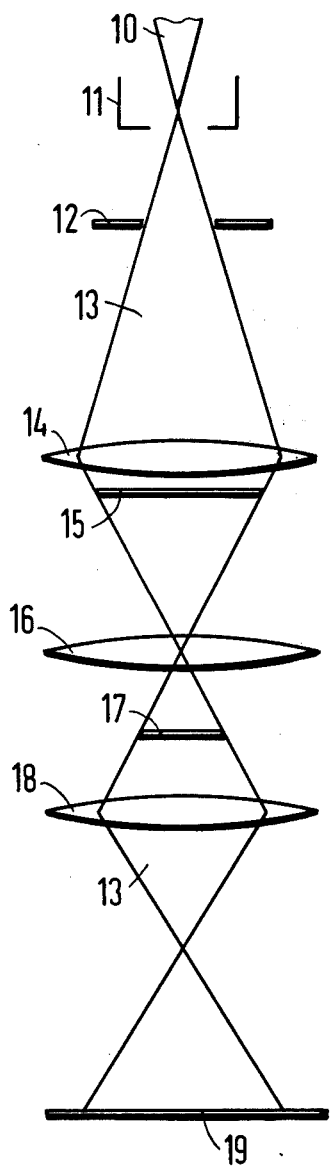
FIG. 1 schematically illustrates an electron beam apparatus.

Referring to the drawings and more particularly to FIG. 1, the electron beam apparatus illustrated comprises an electron beam generating system having a pointed cathode 10, a Wehnelt cylinder 11 and an anode 12. The electron beam 13 passes through an opening in the anode out of the electron beam system and, following passage through a first magnetic collector lens i.e. a condenser 14, the electron beam impacts the mask 15 constructed in accordance with the invention. The beam subsequently traverses a second collector lens, i.e. the focusing lens 16, following which the beam is deflected upon the layer 17 which is to be configurated, to provide a structure corresponding to the contouring of the mask. As the structures produced are extremely small, and as a result difficult to perceive without additional means, it is expedient to provide an observation system, which, in the example illustrated in FIG. 1, comprises a further electron-optical collector lens 18, from which an image of the configurated structure is projected, in enlarged form, on a screen 19, thus rendering the same visible.

In accordance with known techniques in connection with light image projectors, it is expedient to employ a condenser 14 having a focal length such that the image of the cathode point is disposed approximately in the center of the focusing lens 16, thereby insuring that all of the electrons which strike the condenser also pass through the focusing lens 16, whereby no radiation energy is lost.

The electron-optical lenses also can be in the form of lens systems. The anode voltage may, for example, amount to 20,000 V.

Figure 2:
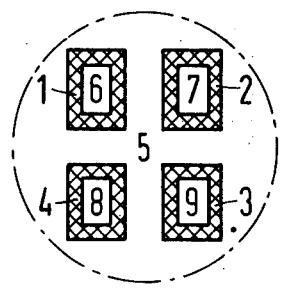
FIGS. 2 and 3 illustrate types of mask structures.
Figure 3:
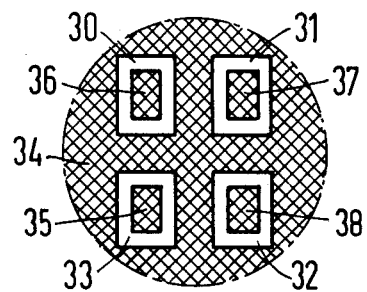

The general construction of masks employed in the practice of the invention are illustrated in FIGS. 2 and 3, FIG. 2 illustrating a first example in which the respective areas 1, 2, 3, and 4 of the mask are transparent or permeable for the electron beams and, in accordance with the preferred embodiment of the invention, are in the form of a mesh structure. Areas 5, 6, 7, 8 and 9 which are impermeable to the electron beams are in the form of suitable metal layers.

FIG. 3 illustrates a mask in which the configurations are a negative image of those of the mask illustrated in FIG. 2, with the areas 30, 31, 32, and 33 being formed from metal layers which are impermeable to electron beams, while the mesh areas 34, 35, 36, 37 and 38 of such mask are permeable to electron beams.

It will be appreciated that each mask can contain more than four images of structures to be produced, such as illustrated in FIGS. 2 and 3. Actually, masks can readily be produced for several thousand structurs, with the images of such structures then simultaneously being projected on the layer which is to be configurated, whereby a corresponding number of such structures can be produced.

It will also be apparent that masks can be produced for structures of substantially any desired shape, as compared with those illustrated, the latter being selected merely for reasons of simplicity in the drawing.

It will be appreciated from FIG. 2 that the invention has the advantage that the areas 6, 7, 8 and 9 which are impermeable to the electron beams can be completely supported by the mesh-like support structures, without the use of additional support means.

Figure 4:
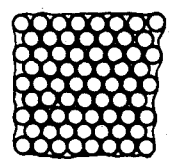
FIGS. 4 and 5 illustrate details of respective types of supporting structures for the masking members.
Figure 5:
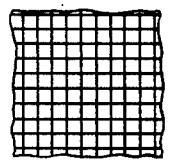

FIGS. 4 and 5 illustrate two examples of support structures employing a mesh-like apparatus. FIG. 4, for example, illustrates a mesh generally similar to a round-hole type screen or filter, whereas as FIG. 5 illustrates a mesh of rectangular configuration in which the openings therein are approximately square. Both types of mesh structures are so designed that the supporting elements forming the cross members of the mesh are 2 $\mu$, or less in width, while the diameter of the round holes, and the width of the square holes are greater than 2 $\mu$.

FIGS. 6 through 10 illustrate cross sections of base and mask structures during various steps in the production thereof.

Figure 6:
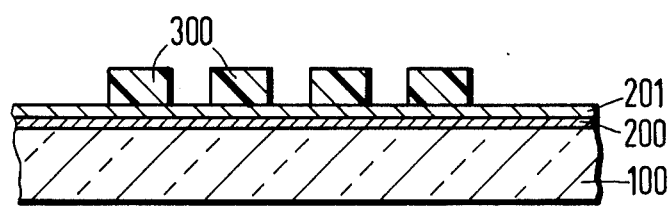
FIGS. 6–10 represent sections through structures representing various steps in the production of the masks.

Thus, FIG. 6 illutrates a glass base plate 100 on which is deposited an adhesive 200, of chrome nickel (CrNi), i.e., a layer that will provide good adhesion between the glass plate and the mask structure to be produced, which layer may have a thickness of approximately 100–200 A, and a copper layer 201 having a thickness of approximately 1000 A, which are vapor deposited on the glass plate and function as a mask carrier during the production of the mask. A photo lacquer structure 300 is then produced on the copper layer, which photo lacquer structure has a configuration corresponding to the precise negative image of the masking members which are to be produced, and in particular the corresponding areas or points in the negative image of the desired mesh-like supporting structure.

Figure 7:
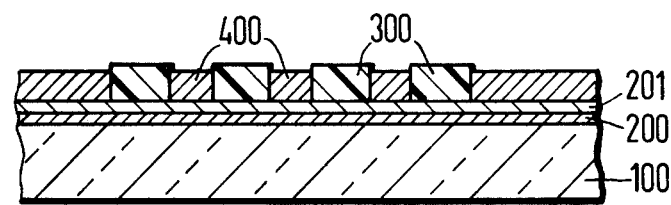

In accordance with FIG. 7 a nickel layer 400, having an approximate thickness of 500 to 20,000 A, is electrolytically deposited on those portions of the copper layer not covered by lacquer, thereby completing the mask, and separation may then be effected of the mask from the base structure, for example by dissolving the copper layer or by mechanically stripping it off.

The mechanical stability of the mask advantageously can be increased in those areas of the mask representing the masking members i.e. the portions of the mask other than the mesh portions. For example, in FIGS. 2 and 3 the areas 5, 6, 7, 8 and 9 of FIG. 2, and the areas 30, 31, 32 and 33 of FIG. 3, which are impermeable to electron beams, can be substantially strengthened or reinforced by an additional metal deposition.

Figure 8:
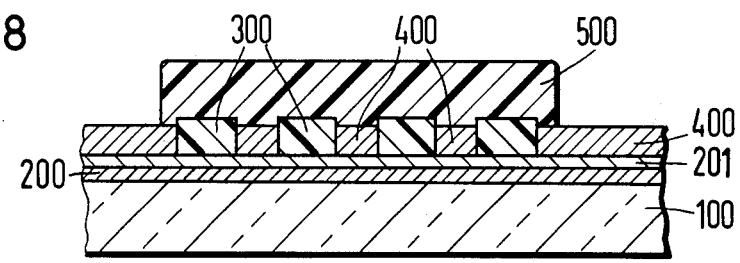
Figure 9:
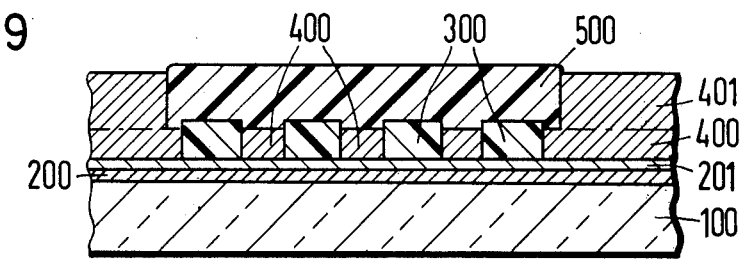
Figure 10:

FIGS. 8–10 illustrate the respective steps in achieving these results. Thus, in FIG. 8, the mesh-like areas of the mask are covered with a thick layer of protective lacquer 500 and thereafter, as illustrated in FIG. 9, those portions of the nickel layer 400, not covered by the additional protective layer, are reinforced or thickened by a further nickel deposition 401. The protective lacquer layers are then removed and the mask separated from the base as previously described with respect to the structure of FIG. 7. A finished mask structure of this type is illutrated, in section, in FIG. 10.

While the previously described materials for the mask structure, as well as the adhesive layer, have proved advantageous, it is also possible to utilize other materials, for example copper or gold in place of nickel for the mask structure, and silver for the adhesive layer. In the event copper is utilized for the mask structure, the copper layer 201 may be omitted.

Meshes such as employed in the invention for the supporting structure are already broadly known from the publication "Kupfer" No. 3 (1972) 22. However, the mesh therein described is considerably coarser than that employed in the invention and could not be employed in connection with the specific operations of the invention. Consequently, an adequate under-radiation effect could be achieved with such a structure only when relatively large masks would be utilized and the images thereof greatly reduced in size electron-optically. Theoretically, if it were attempted to employ meshes of the type described in this publication, the masks would have to be approximately five times larger than those of the invention and would have to be electron-optically projected with a reduction of 20 times. Further, such masks would be quite unwieldly.

Figure 11:
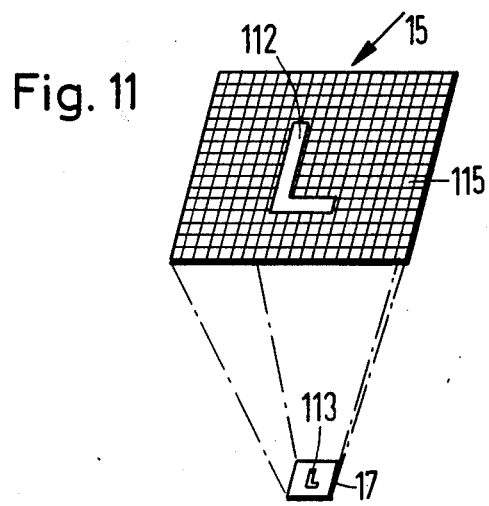
FIG. 11 schematically illustrates the utilization of the defraction or under-radiation effect.

FIG. 11 schematically illustrates the electron-optical projection of the mask 15 on the layer 17, which is to be configurated with only the image 112 of the structure, whereby the configurated structure 113 results. As a result of the under-radiation effect, and the suitable fineness of the mesh supporting structure, the mesh-like supporting elements 115 of the mask are not reproduced on the film.

The masks are fixedly supported in the electron beam apparatus in support frames which may be of the same known type employed in connection with vapor-deposition masks. For example, a suitable frame construction is illustrated and described in German Pat. OS No. 1,796,202.

To eliminate the danger of the masks sagging in the electron beam apparatus, it is advantageous to dispose the electron beam apparatus in such a manner that the optical axis of the beam path is horizontal, whereby the masks are suspended in a vertical position and thus cannot be undesirably deformed by the action of gravity.

It will also be appreciated that the masks can be produced by a variation in the process heretofore described and illustrated in FIGS. 6–10. For example it is possible to initially produce a single mesh structure if the photolacquer layer 300 merely represents a negative image of such a mesh. The solid or impermeable metal layers may then be electrolytically deposited with a configuration corresponding to the structures which are to be produced.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. A mask for use in configurating thin layers, wherein the thin layer to be configurated is irradiated with an electron beam passing through such mask to obtain a configuration on such layer corresponding to the configuration of a masking member carried by such mask, comprising a masking member of thin metal, and a supporting structure for said masking member comprising a plurality of series of fine supporting elements, the elements of each series extending in the same direction and traverse to the direction of another series, said series being interconnected at their intersection to form a mesh-like structure, the elements thereof each being of a width, in transverse cross-section, which is sufficiently small, that in use stray radiation of the electron beam within the thin layer will completely radiate the geometric shadow areas of the supporting elements thereon.

2. A mask according to claim 1, wherein the supporting elements comprising said mesh-like structure have a width, in transverse cross-section, of less than 2 $\mu$, and the openings therebetween have a corresponding width of more than 2 $\mu$.

3. A mask according to claim 2, wherein the mask structure is fabricated from metals selected from the group consisting of nickel, copper and gold.

4. A method for configurating thin layers, wherein the thin layer to be configurated is irradiated with an electron beam passing through a mask to obtain a configuration on such layer corresponding to the configuration of selected portions of such a mask, comprising the steps of positioning the layer to be configurated in the path of an electron beam for irradiation thereby, interposing a masking member, which is impermeable to the electron beam and has a desired configuration, on such beam path between the source of such electron beam and said layer, supporting said masking member by means of relatively very fine supporting elements which extend over areas of the mask which are to be permeable to the electron beam, and spacing the masking member so supported, relative to the layer to be configurated, a distance such that in consideration with the employed widths of the fine supporting elements and parameters with respect to the relative sizes of the masking member and film configuration structures, that stray radiation of the electron beam within the thin layer completely radiates the geometric shadow areas of the fine supporting elements thereon.

5. A method according to claim 4, comprising supporting the masking member with the normal of its surface extending horizontally, and orienting the electron beam axis parallel to said surface normal.

6. A method according to claim 4, comprising supporting such masking member in two transversely extending directions in substantially a common plane.

7. A method according to claim 6, comprising supporting the masking member with the normal of its surface extending horizontally, and orienting the electron beam axis parallel to said surface normal.

8. A mask according to claim 7, wherein the mask structure is fabricated from metals selected from the group consisting of nickel, copper and gold.

* * * * *